(12) United States Patent
Wu et al.

(10) Patent No.: US 7,508,573 B2
(45) Date of Patent: Mar. 24, 2009

(54) OPTICAL SWITCH STRUCTURE

(75) Inventors: Chih-Hung Wu, Taoyuan (TW);
Kai-Sheng Chang, Taoyuan (TW);
Hwa-Yuh Shih, Taoyuan (TW);
Yen-Chang Tzeng, Taoyuan (TW)

(73) Assignee: Atomic Energy Council - Institute of Nuclear Energy Research, Taoyuan (TW)

( * ) Notice: Subject to any disclaimer, the term of this patent is extended or adjusted under 35 U.S.C. 154(b) by 440 days.

(21) Appl. No.: 11/440,422

(22) Filed: May 25, 2006

(65) Prior Publication Data

US 2007/0286251 A1 Dec. 13, 2007

(51) Int. Cl.
*G02F 1/29* (2006.01)
*G02F 1/03* (2006.01)
*H01L 27/14* (2006.01)

(52) U.S. Cl. .......... 359/320; 359/243; 359/248; 359/254; 359/262; 257/431; 257/436; 257/448; 257/449; 257/457; 372/46.015

(58) Field of Classification Search ......... 359/243, 359/248, 254, 262, 320; 257/431, 432, 436, 257/448, 449, 457; 372/46.015
See application file for complete search history.

(56) References Cited

U.S. PATENT DOCUMENTS 3,883,220 A * 5/1975 Taylor .................. 385/132

\* cited by examiner

*Primary Examiner*—Evelyn A. Lester
(74) *Attorney, Agent, or Firm*—Troxell Law Office, PLLC

(57) ABSTRACT

A structure of an optical switch makes the optical switch capable of receiving broadband signals. And the manufacturing procedure is simplified.

9 Claims, 6 Drawing Sheets

OPTICAL SWITCH STRUCTURE

FIELD OF THE INVENTION

The present invention relates to a switch; more particularly, relates to obtaining an optical switch having a broadband receiving capacity with a manufacturing procedure simplified.

DESCRIPTION OF THE RELATED ART

A general optical switch, as revealed in Physical Review B, Vol. 4, No. 8, pp. 2621-2633 (1971), is made through an epitaxial manner, sometimes accompanied with a reaction of $O_2$ and Zn, where the optical switch can be activated by a light source.

But the general optical switch is manufactured under a high temperature and the procedure is not easy. Besides, although the switch can be used under a certain range of bandwidth, the range is not quite wide so that the switch can only be activated by receiving a light source having a wavelength within a certain range, which deprives of a broadband reception. Hence, the prior art does not fulfill users' requests on actual use.

SUMMARY OF THE INVENTION

The main purpose of the present invention is to obtain an optical switch having a broad band receiving capacity with a manufacturing procedure simplified.

To achieve the above purpose, the present invention is an optical switch structure, where a proton-implanted region is deposed on a surface of a substrate; the proton-implanted region is processed with an implantation with an energy between 1 kilo electron volt (KeV) and 1 mega electron volt (MeV); the proton-implanted region has an implantation dose between $1\times10^{12}$ per square centimeter ($1/cm^2$) and $1\times10^{16}/cm^2$; the proton-implanted region is obtained under an annealing ambiance, comprising an inert gas and an annealing temperature; the inert gas has oxygen molecules at least 1 part per million (ppm) and the annealing temperature is located between 350 Celsius degrees (° C.) and 600° C.; and two contact electrodes are separately set at two sides on a surface of the proton-implanted region with a gap in between, or a contact electrode is set on a surface of the substrate and another contact electrode is set on a surface of the proton-implanted region. Accordingly, a novel optical switch structure is obtained.

BRIEF DESCRIPTIONS OF THE DRAWINGS

The present invention will be better understood from the following detailed descriptions of the preferred embodiments according to the present invention, taken in conjunction with the accompanying drawings, in which FIG. 1 is a sectional view showing the first preferred embodiment according to the present invention;

DESCRIPTION OF THE PREFERRED EMBODIMENTS

The following descriptions of the preferred embodiments are provided to understand the features and the structures of the present invention.

Figure 1:
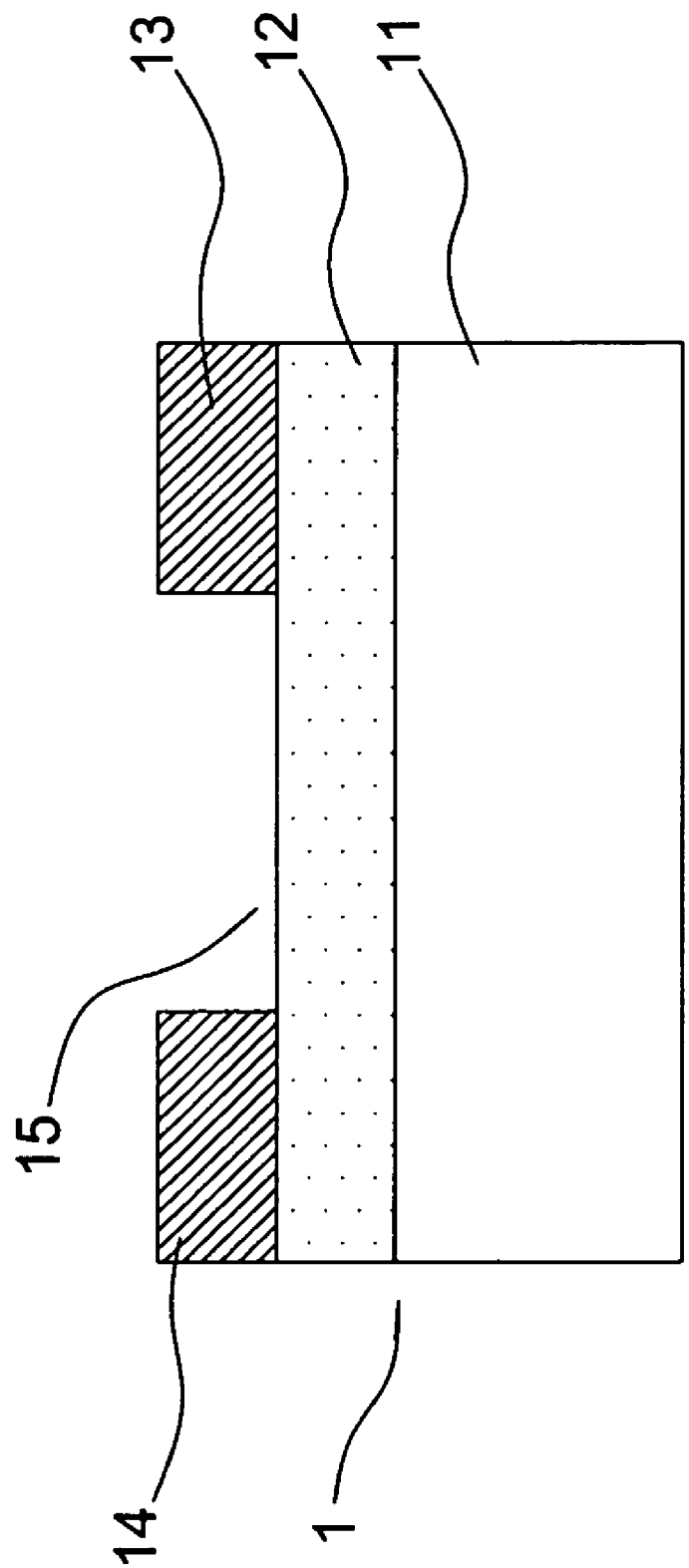

Please refer to FIG. 1, which is a sectional view showing the first preferred embodiment according to the present invention. As shown in the figure, the present invention is an optical switch structure 1, comprising a substrate 11, a proton-implanted region 12 and two contact electrodes 13, 14, where the optical switch 1 has a broadband receiving capacity and the manufacturing procedure is simplified.

The substrate 11 is a zinc-doped gallium phosphide (GaP:Zn) substrate, a GaP:Zn epitaxy substrate or a zinc-doped aluminum gallium phosphide ($Al_xGa_{1-x}P$:Zn) epitaxy substrate, where x is a number between 0 and 1.

The proton-implanted region 12 is deposed on a surface of the substrate 11 is processed with an implantation with an energy between 1 kilo electron volt (KeV) and 1 mega electron volt (MeV); has an implantation dose between $1\times10^{12}$ per square centimeter ($1/cm^2$) and $1\times10^{16}/cm^2$; and is obtained under an annealing ambiance, comprising an inert gas and an annealing temperature, where the inert gas has oxygen molecules at least 1 part per million (ppm) and the annealing temperature is located between 350 Celsius degrees (° C.) and 600° C.

The two contact electrodes 13, 14 are separately set at two sides of a surface of the proton-implanted region 12 so that the two contact electrodes 13, 14 are an anode and a cathode with a gap 15 in between. The contact electrodes 13, 14 are ohmic contact electrodes (AuBe/Ni/Au; where Au stands for aurum, Be for beryllium and Ni for nickel) or Schottky metal contact electrodes. Thus, a novel optical switch structure is obtained.

Figure 2:
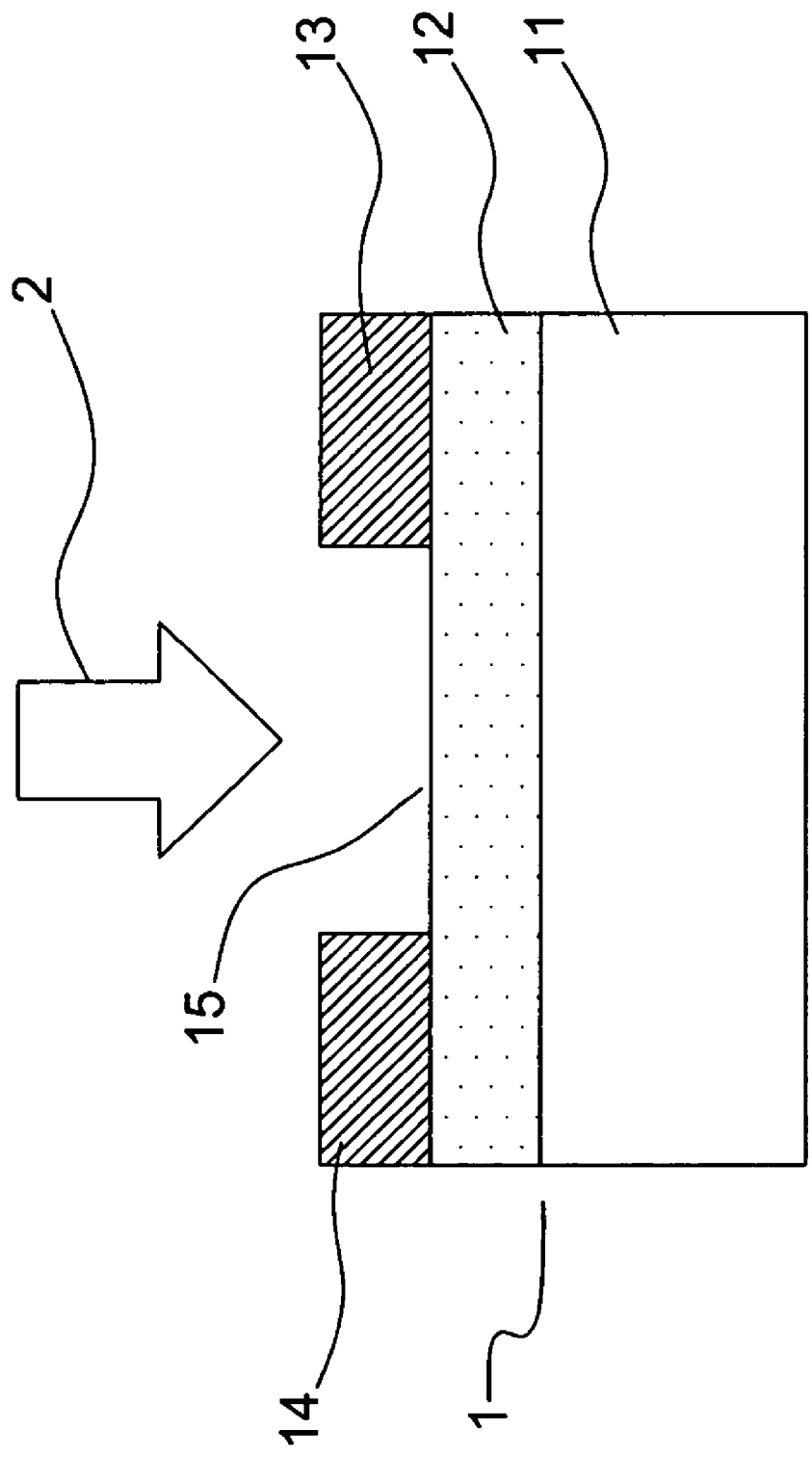
FIG. 2 is a view showing the state of use of the first preferred embodiment.
Figure 3:
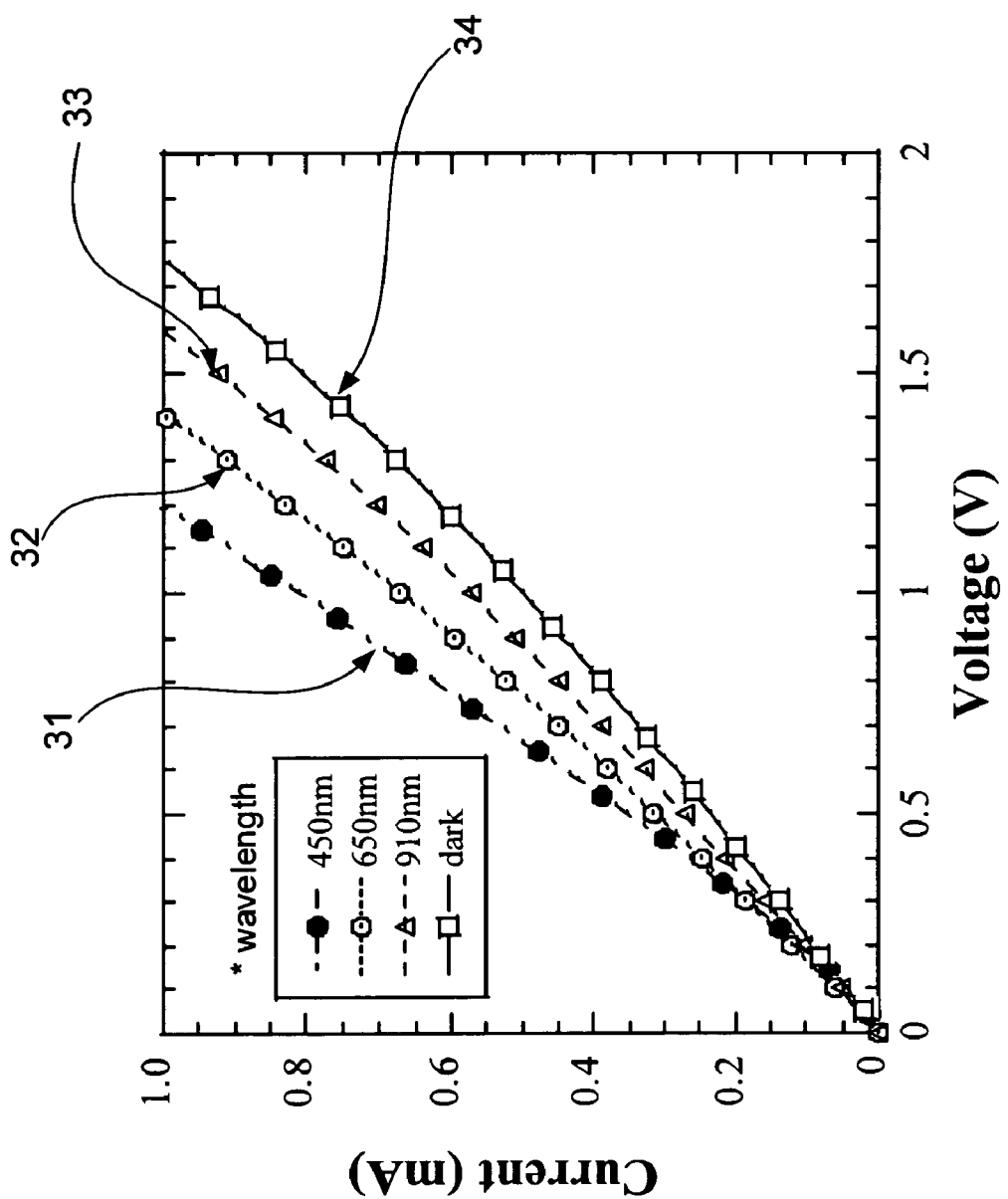
FIG. 3 is a view showing the relations between current and voltage under various wavelengths.
Figure 4:
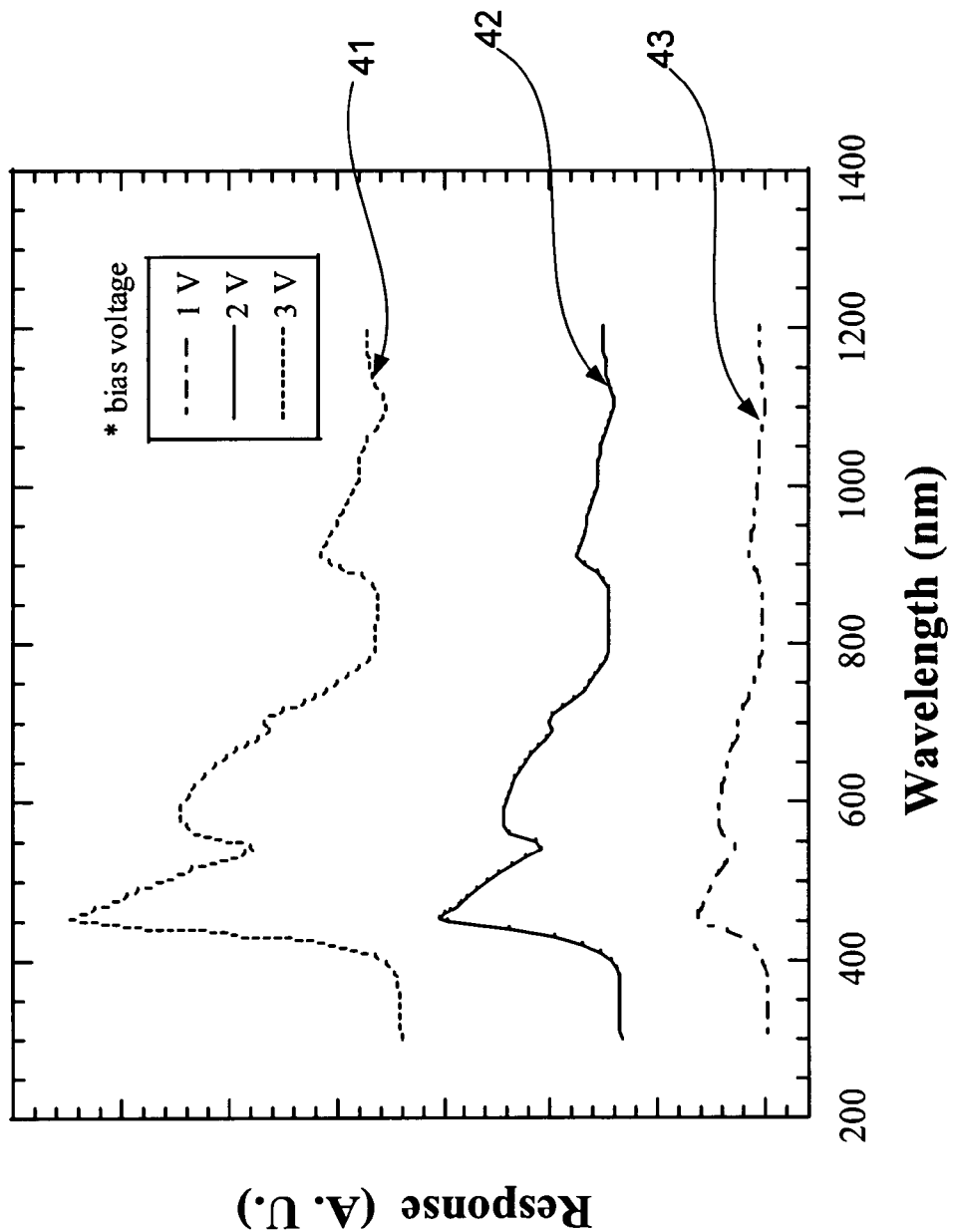
FIG. 4 is a view showing the relations between wavelength and A.U. under various bias voltages.

Please further refer to FIG. 2, which is a view showing the state of use of the first preferred embodiment. As shown in the figure, when applying the present invention, the optical switch 1 is deposed on an electronical device (not shown in the figures); and the electronical device is connected with the two contact electrodes 13, 14 of the optical switch 1 so that the optical switch 1 becomes a switch for the electronical device. When using the optical switch 1, an incident light from a light source 2 enters from the gap 15 between the two contact electrodes 13, 14 so that, according to the characteristics of the proton-implanted region 12 on the substrate 11, the optical switch 1 is activated by a sensing from the proton-implanted region 12. Please refer to FIG. 3, which is a view showing the relations between currents and voltages under various wavelengths. As shown in the figure, four incident lights of a light source with a first wave length 31, a second wavelength 32, a third wavelength 33 and a fourth wavelength 34 separately enter into the present invention and the figure show that, with various wavelengths, various responses of currents to voltages appear by using the present invention. Please refer to FIG. 4, which is a view showing the relations between wavelengths and strength values of response under various bias voltages. As shown in the figure, three bias voltages of a first bias voltage 41, a second bias voltage 42 and a third bias voltage 43 separately show that, under various bias voltages, various strength values of response to wavelengths appear by using the present invention.

Figure 5:
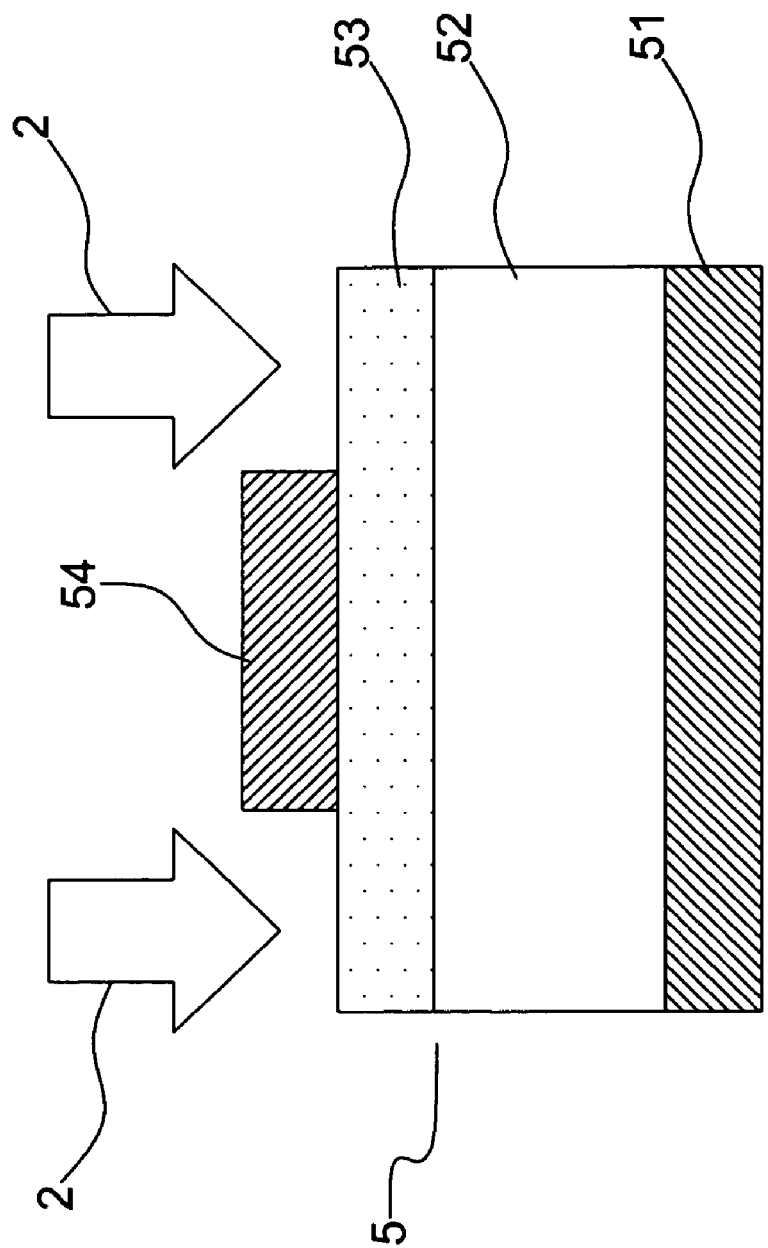
FIG. 5 is a sectional view showing the second preferred embodiment.

Please refer to FIG. 5, which is a sectional view showing the second preferred embodiment. As shown in the figure, an optical switch 5 according to the present invention comprises a first contact electrode 51, a substrate 52, a proton-implanted region 53 and a second contact electrode 54.

The first contact electrode 51 is an ohmic contact electrode (AuBe/Ni/Au).

The substrate 52 is deposed on a surface of the first contact electrode 51; and is a GaP:Zn substrate, a GaP:Zn epitaxy substrate or a $Al_xGa_{1-x}P$:Zn epitaxy substrate, where x is a number between 0 and 1.

The proton-implanted region 53 is deposed on a surface of the substrate 52 is processed with an implantation with an energy of 1 KeV~1 MeV; has an implantation dose of $1\times10^{12}$~$1\times10^{16}$/cm$^2$; and is obtained under an annealing ambiance, comprising an inert gas and an annealing temperature, where the inert gas has at least 1 ppm of oxygen molecules and the annealing temperature is 350~600° C.

The second contact electrode 54 is deposed on a surface of the proton-implanted region 53; and is an ohmic contact electrode (AuBe/Ni/Au) or a Schottky metal contact electrode.

When using the optical switch 5, incident lights from a light source 2 enters from two sides of the second contact electrodes 54 so that, according to the characteristics of the proton-implanted region 53 on the substrate 52, the optical switch 5 is activated by a sensing from the proton-implanted region 53. Hence, the optical switch 5 has a broadband receiving capacity and the manufacturing procedure is simplified.

Figure 6:
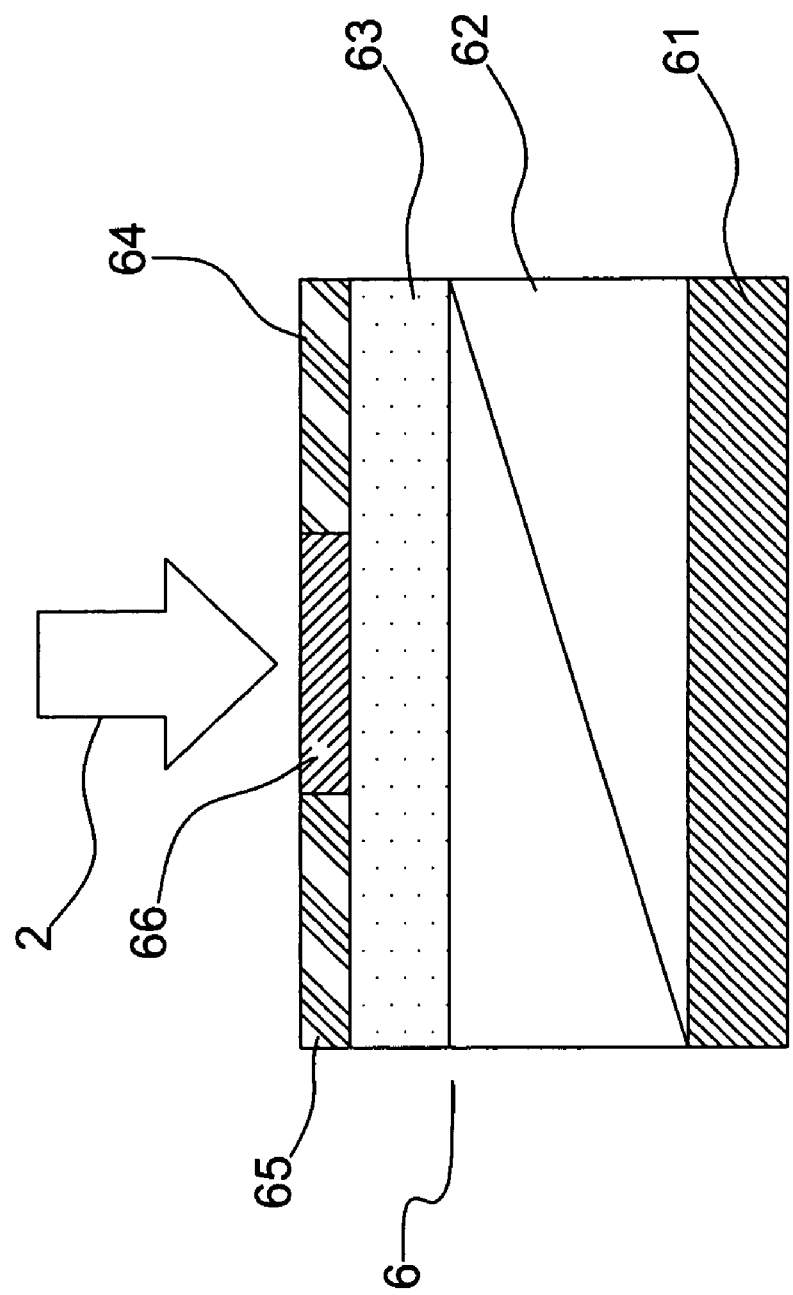
FIG. 6 is a sectional view showing the third preferred embodiment.

Please refer to FIG. 6, which is a sectional view showing the third preferred embodiment. As shown in the figure, an optical switch 6 according to the present invention comprises a contact electrode 61, a substrate 62, a proton-implanted region 63, a metal electrode 64 and an insulating layer 65.

The contact electrode 61 is an ohmic contact electrode (AuBe/Ni/Au).

The substrate 62 is deposed on a surface of the contact electrode 61; and is a GaP:Zn substrate, a GaP:Zn epitaxy substrate or a $Al_xGa_{1-x}P$:Zn epitaxy substrate, where x is a number between 0 and 1.

The proton-implanted region 63 is deposed on a surface of the substrate 62; is processed with an implantation with an energy of 1 KeV~1 MeV; has an implantation dose of $1\times10^{12}$~$1\times10^{16}$/cm$^2$; and is obtained under an annealing ambiance, comprising an inert gas and an annealing temperature, where the inert gas has at least 1 ppm of oxygen molecules and the annealing temperature is 350~600° C.

The metal electrode 64 is deposed on a side surface of the proton-implanted region 63 and is made of a light-transparent material.

The insulating layer 65 is deposed on another side surface of the proton-implanted region 63; is corresponding to the metal electrode 64 with a gap 66 in between; and is made of an oxide or a silicon nitride.

When using the optical switch 6, an incident light from a light source 2 enters from the gap 66 between the metal electrode 64 and the insulating layer 65 so that, according to the characteristics of the proton-implanted region 63 on the substrate 62, the optical switch 6 is activated by a sensing from the proton-implanted region 63. Hence, the optical switch 6 has a broadband receiving capacity and the manufacturing procedure is simplified.

To sum up, the present invention is an optical switch structure, where the optical switch has a broadband receiving capacity and the manufacturing procedure is simplified.

The preferred embodiments herein disclosed are not intended to unnecessarily limit the scope of the invention.

Therefore, simple modifications or variations belonging to the equivalent of the scope of the claims and the instructions disclosed herein for a patent are all within the scope of the present invention.

What is claimed is:

1. An optical switch structure, comprising:
   a first contact electrode;
   a substrate, said substrate being deposed on a surface of said first contact electrode;
   a proton-implanted region, said proton-implanted region being deposed on a surface of said substrate, said proton-implanted region being processed with an implantation with an energy between 1 KeV and 1 MeV, said proton-implanted region having an implantation dose between $1\times10^{12}$/cm$^2$ and $1\times10^{16}$/cm$^2$, said proton-implanted region being obtained under an annealing ambiance, said annealing ambiance comprising an inert gas and an annealing temperature, said inert gas having at least 1 ppm of oxygen molecules, said annealing temperature being located between 350° C. and 600° C.; and
   a second contact electrode, said second contact electrode being deposed on said proton-implanted region, said second contact electrode being located at center of said proton-implanted region.

2. The structure according to claim 1,
   wherein said first contact electrode is an ohmic contact electrode.

3. The structure according to claim 1,
   wherein said substrate is selected from a group consisting of a GaP:Zn substrate, a GaP:Zn epitaxy substrate and a $Al_xGa_{1-x}P$:Zn; and
   wherein said x in said $Al_xGa_{1-x}P$:Zn is a number between 0 and 1.

4. The structure according to claim 1,
   wherein said second contact electrode is selected from a group consisting of an ohmic contact electrode and a Schottky metal contact electrode.

5. An optical switch structure, comprising:
   a contact electrode;
   a substrate, said substrate being deposed on a surface of said contact electrode;
   a proton-implanted region, said proton-implanted region being deposed on a surface of said substrate, said proton-implanted region being processed with an implantation with an energy between 1 KeV and 1 MeV, said proton-implanted region having an implantation dose between $1\times10^{12}$/cm$^2$ and $1\times10^{16}$/cm$^2$, said proton-implanted region being obtained under an annealing ambiance, said annealing ambiance comprising an inert gas and an annealing temperature, said inert gas having at least 1 ppm of oxygen molecules, said annealing temperature being located between 350° C. and 600° C.; and
   a metal electrode, said metal electrode being deposed on a side surface of said proton-implanted region; and
   an insulating layer, said insulating layer being deposed on another side surface of said proton-implanted region corresponding to said metal electrode with a gap between said insulating layer and said metal electrode.

6. The structure according to claim 5,
   wherein said contact electrode is an ohmic contact electrode.

7. The structure according to claim 5,
   wherein said substrate is selected from a group consisting of a GaP:Zn substrate, a GaP:Zn epitaxy substrate and a $Al_xGa_{1-x}P$:Zn; and wherein said x in said $Al_xGa_{1-x}P{:}Zn$ is a number between 0 and 1.

8. The structure according to claim 5, wherein said metal electrode is made of a light-transparent material.

9. The structure according to claim 5, wherein said insulating layer is made of a material selected from a group consisting of an oxide and a silicon nitride.

* * * * *